United States Patent
Simbuerger et al.

(10) Patent No.: US 11,136,237 B2
(45) Date of Patent: Oct. 5, 2021

(54) DEVICE FOR SUPPRESSING STRAY RADIATION

(71) Applicant: INFINEON TECHNOLOGIES AG, Neubiberg (DE)

(72) Inventors: Werner Simbuerger, Haar (DE); Eduardo Schittler Neves, Olching (DE); Andreas Wiesbauer, Poertschach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 127 days.

(21) Appl. No.: 16/581,997

(22) Filed: Sep. 25, 2019

(65) Prior Publication Data

US 2020/0095118 A1   Mar. 26, 2020

(30) Foreign Application Priority Data

Sep. 25, 2018   (DE) .......................... 102018216361.8

(51) Int. Cl.
*B81B 7/00*    (2006.01)
*B81B 3/00*    (2006.01)

(52) U.S. Cl.
CPC .......... *B81B 7/0064* (2013.01); *B81B 3/0086* (2013.01); *B81B 3/0091* (2013.01); *B81B 7/0035* (2013.01); *B81B 2201/0257* (2013.01); *B81B 2201/0264* (2013.01); *B81B 2201/0292* (2013.01)

(58) Field of Classification Search
CPC combination set(s) only.
See application file for complete search history.

(56) References Cited

U.S. PATENT DOCUMENTS

| | | |
|---|---|---|
| 2005/0018864 A1 | 1/2005 | Minervini |
| 2008/0195180 A1* | 8/2008 | Stevenson ................ A61N 1/05 607/60 |
| 2009/0259265 A1* | 10/2009 | Stevenson .............. H05K 3/321 607/2 |
| 2010/0269590 A1* | 10/2010 | Guenther .............. B81B 7/0077 73/514.15 |
| 2012/0160468 A1 | 6/2012 | Larsson |
| 2019/0014421 A1* | 1/2019 | Lim ....................... H04R 19/04 |

FOREIGN PATENT DOCUMENTS

| | | |
|---|---|---|
| DE | 1006916 B | 4/1957 |
| DE | 102009000024 A1 | 7/2010 |
| DE | 102016122525 A1 | 5/2018 |

* cited by examiner

*Primary Examiner* — Nduka E Ojeh
(74) *Attorney, Agent, or Firm* — Slater Matsil, LLP

(57) ABSTRACT

A device for suppressing stray radiation includes a Micro-ElectroMechanical System (MEMS) sensor module and a conductive cage structure. The conductive cage structure may enclose the MEMS sensor module in order to suppress penetration of stray electromagnetic radiation with a stray wavelength $\lambda_o$ into the conductive cage structure, and the conductive cage structure may be arranged to be thermally insulated from the MEMS sensor module. The device may also include a connecting line. The connecting line may be connected to the MEMS sensor module and fed through the conductive cage structure by a capacitive element.

22 Claims, 10 Drawing Sheets

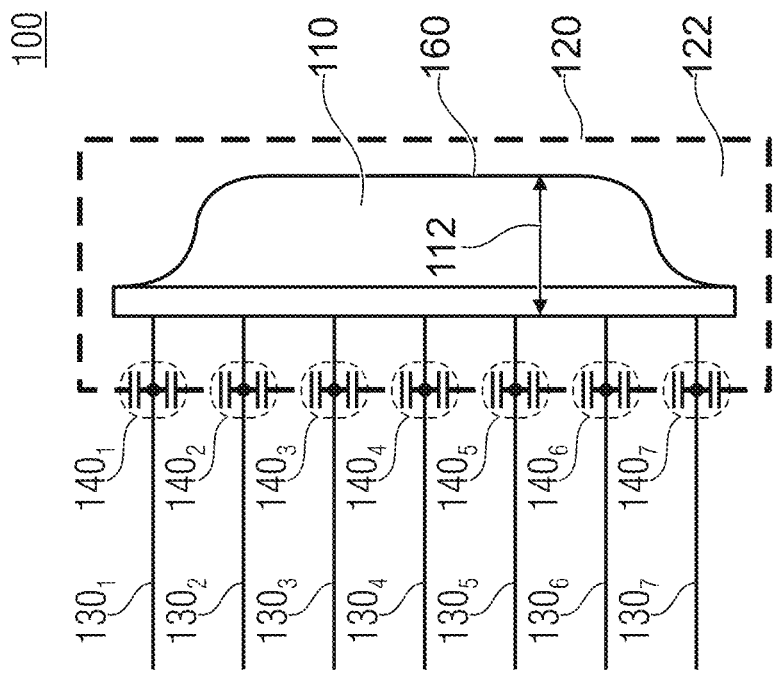
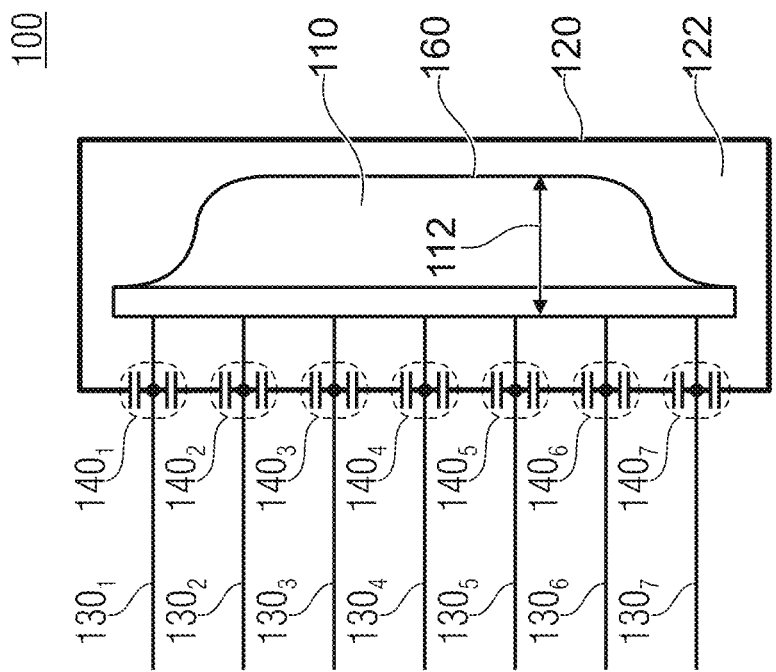

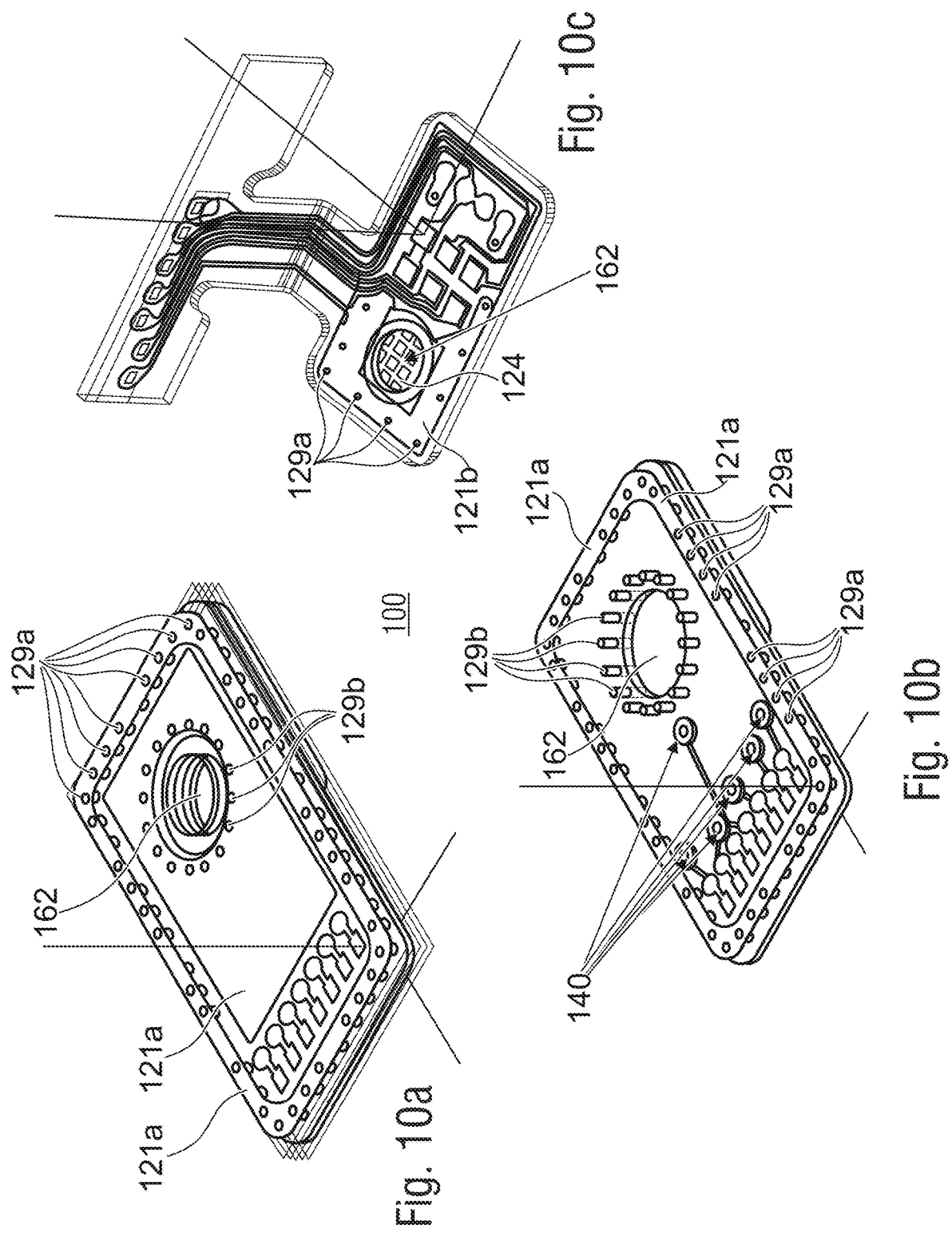

DEVICE FOR SUPPRESSING STRAY RADIATION

This application claims the benefit of German Application No. 102018216361.8, filed on Sep. 25, 2018, which application is hereby incorporated herein by reference.

TECHNICAL FIELD

Exemplary embodiments relate to a device for suppressing stray radiation.

BACKGROUND

According to the prior art R/RC/RCL (R=resistive elements, C=capacitive elements, L=inductive elements) based element filters are used for partial RF (radiofrequency) shielding and additional RFI (electromagnetic inference) suppression.

Hitherto used shielding structures according to the prior art have only a very inadequate shielding effect, and in the case of ever more sensitive Micro-ElectroMechanical System (MEMS) sensors, for example MEMS sound transducers or MEMS microphones, are no longer sufficient to provide the SNR (signal-to-noise ratio) actually available.

In view of this, there is a need for a concept that offers a better compromise between reduction of electrical interference and reduction of electromagnetic/thermal interference for MEMS sensors.

SUMMARY

One exemplary embodiment relates to a device comprising a MEMS sensor module and a conductive cage structure. The conductive cage structure may enclose the MEMS sensor module in order to suppress penetration of stray electromagnetic radiation with a stray wavelength $\lambda_o$ into the conductive cage structure. The conductive cage structure may be arranged thermally insulated from the MEMS sensor module. The device may furthermore comprise at least one connecting line. The at least one connecting line may be connected to the MEMS sensor module and fed through the conductive cage structure by means of a capacitive element.

A MEMS sensor module may be understood as being a MEMS sound transducer module (for example a MEMS microphone), a MEMS gas sensor module, a MEMS pressure sensor module, a MEMS temperature sensor module, a MEMS acceleration sensor module, etc. The list of possible MEMS sensor modules is in this case to be regarded as exemplary and not exhaustive.

This exemplary embodiment of the device is based on the discovery that, by interaction of the conductive cage structure and one (or more) capacitive elements, which may be integrated into the conductive cage structure the MEMS sensor module may be shielded at least partially from stray electromagnetic radiation with a stray wavelength $\lambda o$. By virtue of the fact that the at least one connecting line, which connects the MEMS sensor module for example to an appliance, an electricity supply, etc. outside the conductive cage structure, is fed through the conductive cage structure by means of a capacitive element, stray electromagnetic radiation, which may for example be coupled into the at least one connecting line, may be shielded from the MEMS sensor module of the device with the aid of the capacitive element. With the device, it may furthermore be made possible that, for example, by the conductive cage structure which may act in the manner of a Faraday cage, stray electromagnetic radiation is suppressed. In this case, both stray electromagnetic radiation, for example caused by an external radiofrequency field (RF field) may be prevented from penetrating into the conductive cage structure as far as the MEMS sensor module, and stray radiation emerging from the MEMS sensor module may also be suppressed in order to avoid emission of stray radiation. The device may therefore be configured in order to suppress stray electromagnetic radiation both coupled into connecting lines and stray RF radiation which is possibly generated outside the cage structure or in the sensor module.

A Faraday cage may have the effect that, in the event of static or quasistatic external electric fields, the internal volume remains field-free because of its influence. In the case of time-varying processes such as electromagnetic waves, the shielding effect is based on the eddy currents formed in the conductive envelope, which counteract the external electromagnetic field. Static or slowly varying magnetic fields (such as the terrestrial magnetic field) are not shielded by a Faraday cage.

This could be achieved by a material having a high magnetic permeability (for example mu-metal).

The conductive cage structure may furthermore be arranged thermally insulated from the MEMS sensor module. In this way, for example, the MEMS sensor module may be at least partially shielded from electromagnetic/thermal interference.

It is therefore to be established that the device makes it possible to reduce electrical interference, for example stray electromagnetic radiation with a stray wavelength ho, with for example a conductive cage structure and/or a capacitive element, and to reduce electromagnetic/thermal interference likewise, for example, with the conductive cage structure. The MEMS sensor module of the device may therefore be shielded from electrical interference and/or electromagnetic/thermal interference.

BRIEF DESCRIPTION OF THE DRAWINGS

Exemplary embodiments will be explained in detail below with reference to the appended figures. With regard to the schematic figures represented, it is to be pointed out that the functional units represented as well as elements or features of the device are also to be understood as corresponding method steps of the method, and corresponding method steps of the method may also be derived therefrom.

FIG. 5a shows a schematic representation of a device having a MEMS sensor module, which comprises a housing and is connected to seven connecting lines, according to one exemplary embodiment;

FIG. 5b shows a schematic representation of a device having a MEMS sensor module, which comprises a housing that is enclosed by a conductive cage structure which comprises a conductive mesh structure, according to one exemplary embodiment;

FIG. 10a shows a schematic representation of a device which comprises a layered construction, according to one exemplary embodiment;

FIG. 10b shows a schematic representation of a device which comprises a layered construction and a conductive cage structure with vias, according to one exemplary embodiment; and FIG. 10c shows a schematic representation of at least one plane of a device which is constructed in a layered fashion, according to one exemplary embodiment.

DETAILED DESCRIPTION OF ILLUSTRATIVE EMBODIMENTS

Before exemplary embodiments are further explained in detail below with the aid of the drawings, it is to be pointed out that elements, objects and/or structures which are identical, functionally equivalent or have the same effect in the various figures are provided with the same and/or similar references, so that the description of these elements as presented in different exemplary embodiments is mutually interchangeable and/or may be applied to one another.

Figure 1:
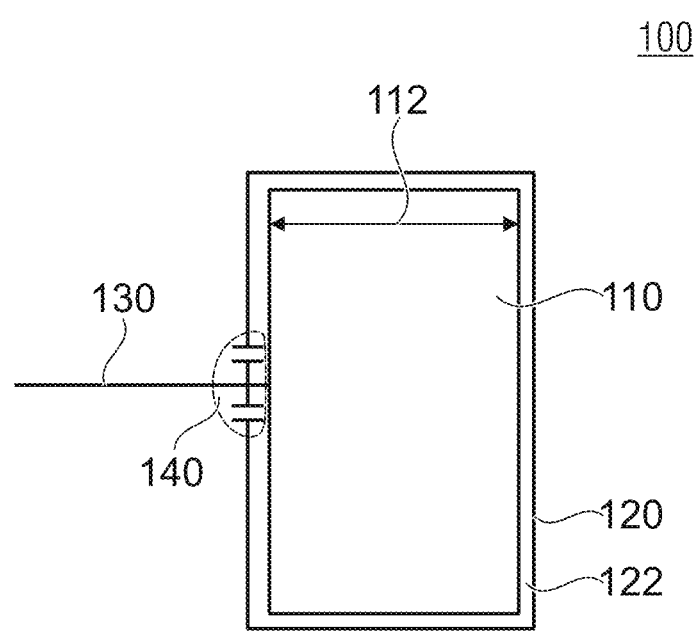
FIG. 1 shows a schematic representation of a device according to one exemplary embodiment.

FIG. 1 shows a schematic representation of a device 100 according to one exemplary embodiment. The device 100 comprises a MEMS sensor module 110 and a conductive cage structure 120. The conductive cage structure 120 encloses the MEMS sensor module 110 in order to suppress penetration of stray electromagnetic radiation with a stray wavelength $\lambda_o$ into the conductive cage structure 120. The conductive cage structure 120 is for example at a distance from the MEMS sensor module 110, so that an intermediate space 122 is formed, by which the conductive cage structure 120 is arranged thermally insulated from the MEMS sensor module 110. In this case, the separation may for example lie in a range of a few micrometers. In the intermediate space 122 resulting from the separation, the thermal insulation may for example be carried out by air or insulation material. The insulation material (thermally insulating medium) may be arranged at least in regions in the intermediate space. It may for example be a gas, for example air, a ceramic, a thermoplastic, oil, gas, etc. The list of possible insulation materials is in this case to be regarded as exemplary and not exhaustive. The device 100 furthermore comprises at least one connecting line 130. The at least one connecting line 130 may be connected to the MEMS sensor module 110 and fed through the conductive cage structure 120 by means of a capacitive element 140.

The conductive cage structure 120 may comprise a conductive mesh structure at least in regions. In this case, the remaining regions of the conductive cage structure 120 may, for example, comprise a continuous metal layer. In other words, the continuous metal layer may fully enclose the MEMS sensor module except for the conductive mesh structure. It is, however, also possible for the entire conductive cage structure 120 to comprise the conductive mesh structure, so that the MEMS sensor module 110 is for example fully enclosed by the conductive mesh structure. The effect achievable by the mesh structure is that a pressure change, for example caused by a temperature change, in the intermediate space 122 formed by the separation may be compensated for by pressure equilibration taking place between the intermediate space 122 and the surroundings. For example, it may happen that the conductive cage structure 120 is heated by stray electromagnetic radiation and therefore releases thermal energy to a medium in the intermediate space 122, so that there may for example be a pressure increase in the intermediate space if the intermediate space is, for example, filled with the medium air. This induced pressure increase may be compensated for by the mesh structure in the conductive cage structure 120. The conductive cage structure 120 may therefore be configured in order to at least partially shield electromagnetic/thermal interference from the MEMS sensor module 110.

The shielding of electromagnetic/thermal interference by means of the conductive cage structure 120 is in this case, for example, advantageous for all types of MEMS sensor modules, for example a MEMS sound transducer module (for example a MEMS microphone), a MEMS gas sensor module, a MEMS pressure sensor module, a MEMS temperature sensor module, a MEMS acceleration sensor module, etc. By the shielding, perturbations caused by temperature changes during detection of properties of the surroundings by the MEMS sensor module may be reduced. Then, for example in the case of a MEMS sound transducer module, electromagnetic thermoacoustic interference is shielded.

According to one exemplary embodiment, the conductive mesh structure of the conductive cage structure 120 may be fluidically transparent and have a lattice spacing g which is at most $\frac{1}{100}$ of the stray wavelength $\lambda_o$ of the stray radiation to be suppressed and at most $\frac{1}{10}$ of the shortest edge length K 112 of the MEMS sensor module 110 ($g \leq \frac{1}{100}\lambda_o$, $g \leq \frac{1}{10}K$). By the fluidic transparency of the conductive mesh structure, on the one hand it is possible to achieve the effect that electromagnetic/thermal interference is suppressed by pressure equilibration and/or the MEMS sensor module 110 is fluidically coupled to the surroundings, so that for example a MEMS sound transducer module can detect sound from the surroundings, a MEMS gas sensor module can detect gases from the surroundings or a MEMS pressure sensor module can detect pressure changes in the surrounding atmosphere. By the lattice spacing g of the conductive mesh structure of the conductive cage structure 120, it is possible to achieve the effect that stray electromagnetic radiation with a stray wavelength a is at least partially shielded by the MEMS sensor module 110. In this way, it is possible to achieve the effect that the signal-to-noise ratio (SNR) for the detection of ambient parameters with the MEMS sensor module is improved.

According to one exemplary embodiment of the device 100, the lattice spacing g of the mesh structure of the conductive cage structure 120 may be at most $\frac{1}{200}$, $\frac{1}{500}$, $\frac{1}{800}$ or $\frac{1}{1000}$ of the stray wavelength $\lambda_o$ of the stray radiation to be suppressed. The conductive cage structure 120 may therefore be configured in order to suppress penetration of stray electromagnetic radiation with a stray wavelength $\lambda_o$ into the conductive cage structure 120. The lattice spacing g represents an optimized compromise between strong shielding of stray electromagnetic radiation and shielding of thermal interference.

According to one exemplary embodiment, the conductive cage structure 120 may comprise a continuous metal layer with an opening. The opening may have the same properties as the conductive mesh structure. For example, the opening may be fluidically transparent in order to suppress electromagnetic/thermal interference and/or to couple the MEMS sensor module 110 to the surroundings, so that the MEMS sensor module 110 can detect properties of the surroundings. Furthermore, the opening may have a diameter which is at most $\frac{1}{100}$ of the stray wavelength $\lambda_o$ of the stray radiation to be suppressed. In this case, even a smaller opening of at most $\frac{1}{200}$, $\frac{1}{500}$, $\frac{1}{800}$ or $\frac{1}{1000}$ of the stray wavelength $\lambda_o$ of the stray radiation to be suppressed is possible. In this way, for example, it is ensured that the MEMS sensor module 110 is at least partially shielded from electrical interference, i.e., that the conductive cage structure 120 is for example configured in order to suppress stray radiation.

The opening may, for example, in this case assume a very wide variety of shapes. The opening may for example be a circle, a square, a rectangle, a triangle, a polygon, etc. Depending on the shape of the opening, the diameter may be defined differently. For instance, in the case of a circle the diameter may be defined as the diameter, in the case of a square or a rectangle as the diagonal, in the case of a triangle as the vertical, and in the case of a polygon as the internal dimension. The list of possible shapes for the opening is in this case to be regarded as exemplary and not exhaustive.

According to one exemplary embodiment, the conductive cage structure 120 may be configured as a mechanical particle protection. Since the conductive cage structure 120 may comprise a continuous metal layer, a conductive mesh structure with a very small lattice spacing g, and/or an opening with a very small diameter, particles may for example be shielded from the MEMS sensor module 110. In this way, for example, the quality of the MEMS sensor module 110 during the detection of properties of the surroundings may be improved by improving the SNR.

According to one exemplary embodiment, the conductive cage structure 120 may be configured in order to conduct acoustic sound waves with low attenuation through the conductive cage structure 120. In this way, for example, the MEMS sensor module 110 as a MEMS sound transducer module may detect scarcely influenced acoustic sound waves. This may make it possible that the MEMS sensor module 110 can very accurately record/detect acoustic properties of the surroundings.

According to one exemplary embodiment, the conductive cage structure 120 may be configured in such a way that it withstands mechanical stresses during use.

According to one exemplary embodiment, the capacitive element 140 may be configured in order to dissipate stray radiofrequency signals from the at least one connecting line 130 onto surfaces of the conductive cage structure 120 which face away from the MEMS sensor module 110. In this way, the capacitive element 140 and the conductive cage structure 120 cooperate so that stray radiofrequency signals are shielded from the MEMS sensor module 110 and the MEMS sensor module 110 thus picks up only small to no stray influences.

According to one exemplary embodiment, the capacitive element 140, by which the at least one connecting line is fed through the conductive cage structure, may have at least a capacitance of for example $$C \geq \frac{1}{\omega_0} \cdot X_C = \frac{1}{\omega_0},$$

where the reactance may be $X_c \leq 1$ ohm and $\omega_0$ is the angular frequency of the stray electromagnetic radiation with a stray wavelength $\lambda_o$. For example, this ensures that stray radiation with a frequency higher than the angular frequency $\omega_0$, coupled in onto the at least one connecting line 130, is suppressed by the capacitive element 140 and the MEMS sensor module 110 can therefore be shielded from stray electromagnetic radiation.

According to one exemplary embodiment, the capacitive element 140 may be a coaxial feed-through capacitor. The capacitive element 140 may therefore act as an interference suppression element. The feed-through capacitor (the capacitive element 140) may, for example, be configured in order to act as a lowpass filter and therefore, for example, to block high frequencies and transmit low frequencies and direct current.

Optionally, the capacitive element may be a feed-through capacitor, a plate capacitor, a variable capacitor in which a capacitance can be varied or other types of capacitors. The list of possible capacitive elements is in this case to be regarded as exemplary and not exhaustive.

Optionally, the device 100 may comprise at least one impedance-matched connecting line in the form of a coaxial cable, with which RF signals (radiofrequency signals) can be transmitted to the MEMS sensor module 110. By virtue of the impedance-matched connecting line, for example in the form of a coaxial cable, RF signals to be transmitted are influenced only scarcely or not at all by stray electromagnetic radiation. This can make it possible that the MEMS sensor module 110 may also receive radiofrequency signals without a stray radiation influence.

According to one exemplary embodiment, the conductive cage structure 120 may be connected to a reference potential or a ground potential. In this way, for example, the conductive cage structure 120 may be grounded.

According to one exemplary embodiment, the MEMS sensor module 110 may be connected via a connection to the conductive cage structure 120 potential-free (for example floating), to a reference potential or to a ground potential.

For example, a separate connecting line 130 is therefore not required for the reference potential or ground potential of the MEMS sensor module 110.

With the features described herein, the device 100 is suitable, for example, for being installed in cell phones or mobile devices. In this case, the MEMS sensor module 110 may for example be a MEMS sound transducer module (for example a silicon microphone). Silicon microphones (and other types of components) are fitted extremely close to the radiofrequency (RF) transmission antennas in cell phones or mobile devices. Strong radiofrequency interference (RFI) therefore occurs, which may cause an undesired audible distortion for different reasons:

a) electrical perturbations
b) electromagnetic/thermal interference.

The device 100 described herein comprises a new packaging concept (for example conductive cage structure 120 with mesh structure or opening, combined with capacitive element 140) in order to avoid both types of interference mentioned above.

The device 100 solves this problem, for example, by the conductive cage structure 120 with a capacitive element 140 (which, for example, may be appropriate use of a Faraday cage) for all types of sensors or components.

The conductive cage structure 120 may prevent stray electromagnetic radiation as well as coupled stray electromagnetic/thermal radiation at all frequencies.

Figure 2:
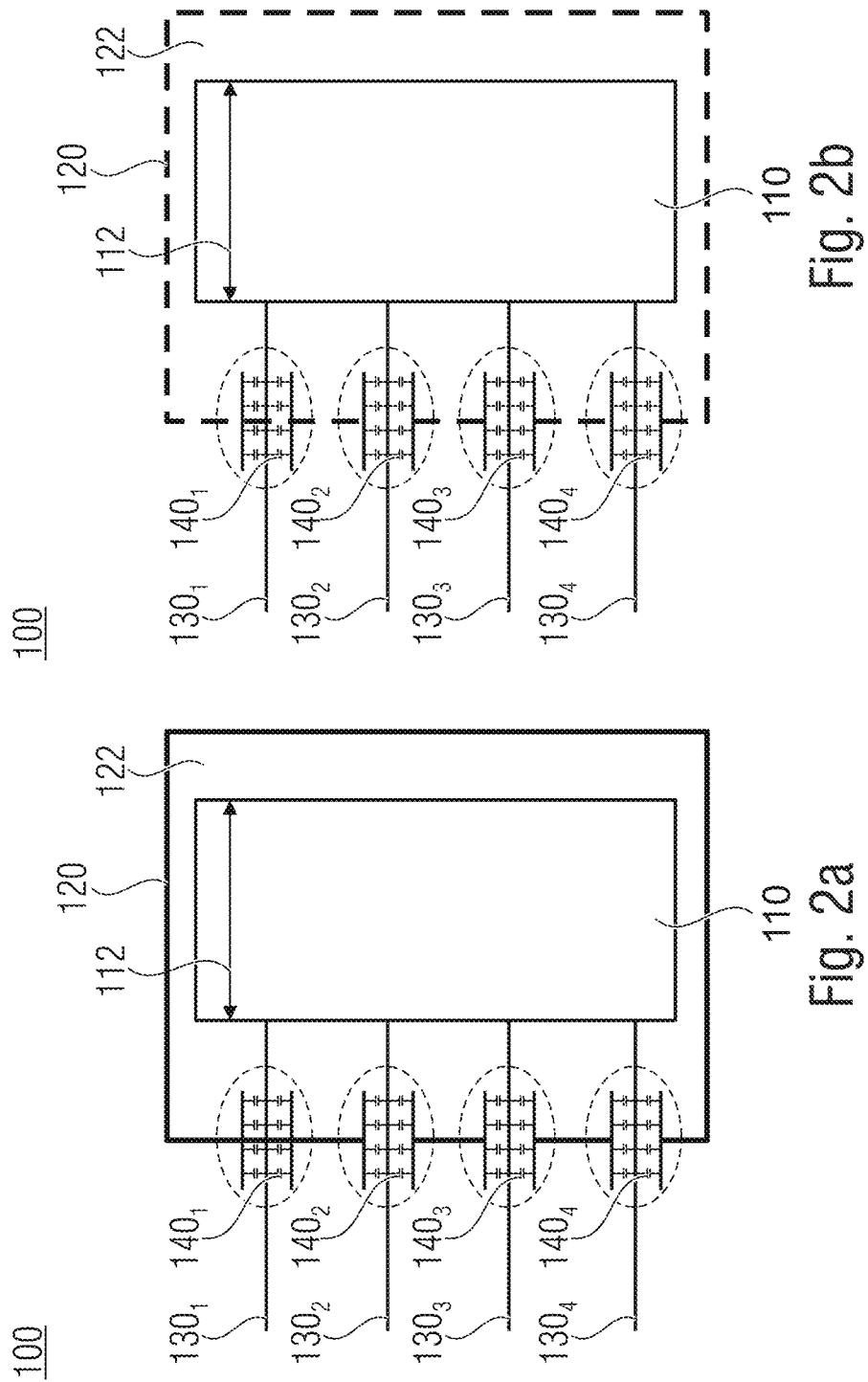
FIG. 2a shows a schematic representation of a device having four connecting lines according to one exemplary embodiment.
FIG. 2b shows a schematic representation of a device having a conductive cage structure, which comprises a conductive mesh structure, according to one exemplary embodiment.

FIG. 2a shows an exemplary embodiment of a device 100. The device may comprise the same features and functionalities as the device 100 of FIG. 1. In contrast to the device 100 of FIG. 1, the device 100 of FIG. 2a comprises four connecting lines $130_1$ to $130_4$, each having a capacitive element $140_1$ to $140_4$. The connecting lines $130_1$ to $130_4$ may be independent of one another. The four connecting lines $130_1$ to $130_4$ may, for example, comprise one line for the energy supply of the MEMS sensor module 110 and two lines for input/output signals (I/O). The ground (GND) may also be used as a connecting line.

Although the conductive cage structure 120 of the device 100 is represented as a continuous line, this does not necessarily mean that the conductive cage structure 120 comprises a continuous metal layer encasing the entire MEMS sensor module. It is likewise possible, as described for the conductive cage structure 120 of FIG. 1, for the conductive cage structure 120 to comprise a conductive mesh structure.

FIG. 2b shows a device 100 which may comprise the same features and functionalities as the device 100 of FIG. 2a. In FIG. 2b, however, the conductive cage structure 120 is represented as a dashed line. This may mean that the conductive cage structure 120 comprises a conductive mesh structure which fully encloses the MEMS sensor module 110.

Incident and emitted radiofrequency perturbations may form a current distribution in the outer skin of the conductive cage structure 120 (surfaces facing away from the MEMS sensor module 110), so that heating of the surfaces of the conductive cage structure 120 may be induced. In other words, the conductive cage structure 120 may be heated by the shielding of stray electromagnetic radiation.

If the MEMS sensor module 110 comprises a microphone, acoustic wave transmission may be possible inside the conductive cage structure 120. The conductive cage structure 120 may therefore be formed by a conductive mesh structure, for example a grid, which is transparent for acoustic sound waves.

The lattice spacing g of the conductive cage structure 120 may, for example, be much less than the free-space wavelength of the stray electromagnetic radiation. In other words, the stray electromagnetic radiation may also be defined as an interference signal. If, for example, the MEMS sensor module 110 comprises a very small microphone sensor with physical dimensions of several millimeters, the following lattice spacing g, for example, ensures a sufficient shielding effect at frequencies $\geq \omega_o$:

$$g = \frac{\lambda_0}{1000} = \frac{2\pi c}{1000\omega_0}$$

where $\lambda_o$ defines the stray wavelength/free-space wavelength of the stray electromagnetic radiation and c defines the speed of light in a vacuum. According to one exemplary embodiment of the device 100, the conductive mesh structure is fluidically transparent and has a lattice spacing g which is at most $1/100$, $1/200$, $1/500$ or $1/800$ of the stray wavelength $\lambda_o$ of the stray radiation to be suppressed. By virtue of the lattice spacing g selected in this way, the MEMS sensor module 110 can be shielded sufficiently from stray radiation with wavelengths $\leq \lambda_o$.

Figure 3:
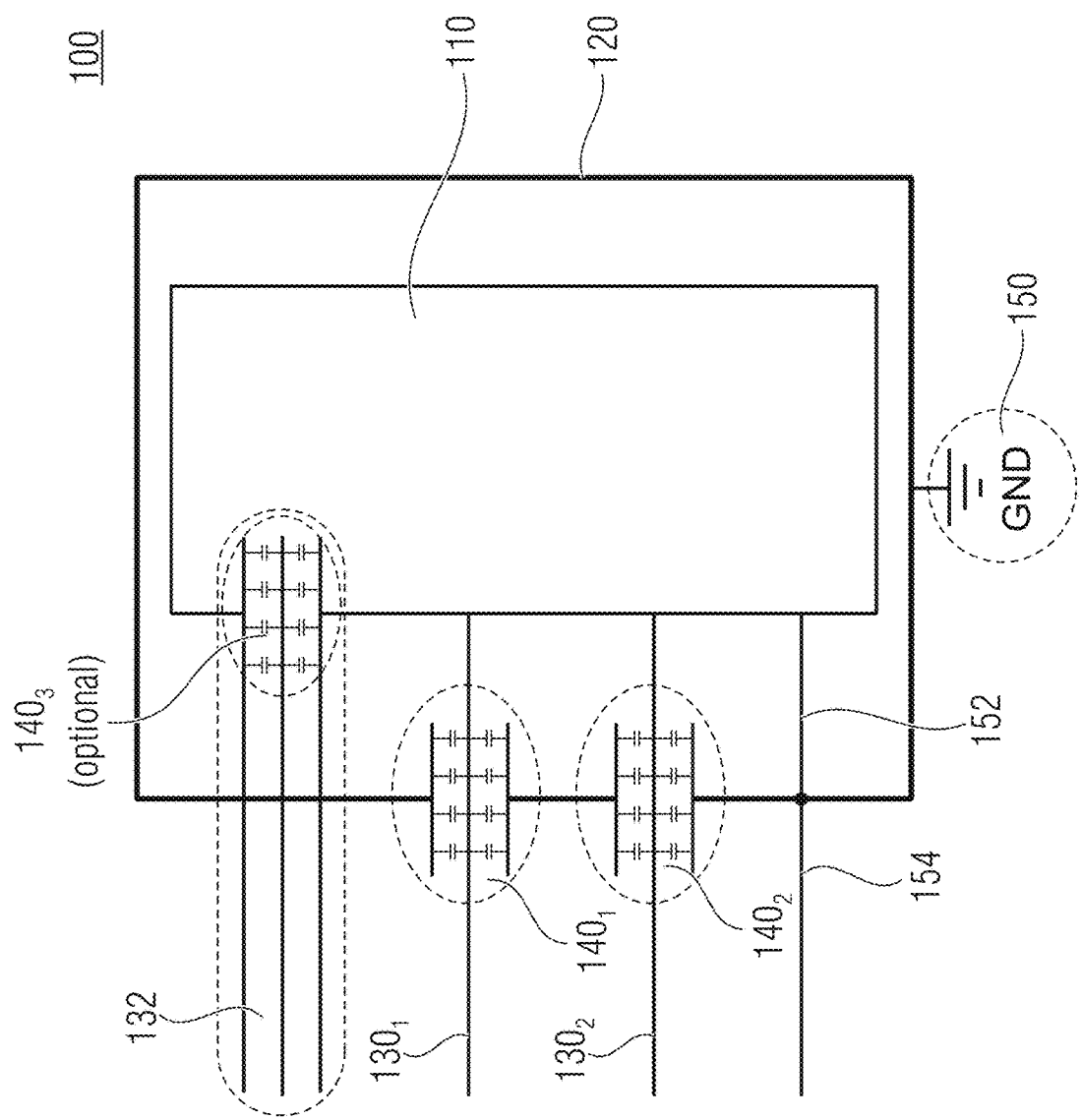
FIG. 3 shows a schematic representation of a device having an impedance-matched connecting line according to one exemplary embodiment.

FIG. 3 shows an exemplary embodiment of the device 100. In this case, the device 100 comprises a MEMS sensor module 110, a conductive cage structure 120 enclosing the MEMS sensor module 110, and two connecting lines $130_1$, $130_2$, which are respectively fed through the conductive cage structure 120 by means of a capacitive element $140_1$, $140_2$ and are connected to the MEMS sensor module 110. Optionally, the device 100 may comprise an impedance-matched transmission line 132 which can transmit radiofrequency signals with only low or no stray electromagnetic radiation to the MEMS sensor module 110. In other words, the device 100 may comprise at least one impedance-matched connecting line (transmission line 132) in the form of a coaxial cable, with which RF signals can be transmitted to the MEMS sensor module 110.

The coaxial RF transmission line 132 emits no or scarcely any electromagnetic radiation outward, and is also shielded against electromagnetic radiation from the outside. The coaxial RF transmission line 132 may therefore already represent a good Faraday cage [1].

The impedance-matched transmission line 132 may be an example of a connecting line. Optionally, the impedance-matched transmission line 132 may comprise a capacitive element $140_3$ at the end of the transmission line 132 at which the transmission line is connected to the MEMS sensor module 110. In this case, for example, capacitive elements may be arranged between an inner conductor and an outer conductor, the outer conductor shielding the inner conductor from stray radiation. The impedance-matched transmission line 132 therefore represents very good shielding since electromagnetic fields, for example, are conducted only inside the cable and do not penetrate outward or become influenced by stray radiation from the outside. So that electromagnetic interference in the MEMS sensor module 110 is suppressed, the capacitive element $140_3$ may be formed as secondary protection against electromagnetic radiation. The capacitive element $140_3$ comprises, for example, at least one capacitor. Furthermore, the capacitive element $140_3$ may have a low impedance (for example a short circuit in the ideal case) for high frequencies.

The I/O connecting lines $130_1$, $130_2$ may be short-circuited to the conductive cage structure by means of the capacitive elements $140_1$, $140_2$. If a lower cutoff frequency $\omega_o$ of the shielding effect is defined, a rule of thumb may be derived for the value of the capacitor C (capacitive element $140_1$, $140_2$, $140_3$) on the basis of the reactance $X_c$:

$$X_C = \frac{1}{\omega_0 \cdot C} \leq 1$$

$$C \geq \frac{1}{\omega_0 \cdot X_C} = \frac{1}{\omega_0}.$$

Optionally, the capacitive element $140_1$, $140_2$, $140_3$ may be produced as coaxial feed-through capacitors. A capacitance of the coaxial feed-through capacitors may, with the assumption that $X_c=1$ at a frequency $\omega_o$, be calculated as follows:

$$C = \frac{2\pi\epsilon_0\epsilon_r l}{\ln\frac{d_2}{d_1}} = \frac{2\pi\epsilon_0\epsilon_r l}{\ln\frac{d_1+2s}{d_1}} = \frac{2\pi\epsilon_0\epsilon_r l}{\ln\frac{d_2}{d_2-2s}} = \frac{1}{\omega_0}$$

By solving this formula, which is based on the assumption that the reactance $X_c=1$ at a frequency $\omega_o$, a required thickness of a dielectric layer of the coaxial feed-through capacitor may be calculated as follows:

$$s=\tfrac{1}{2}d_1(e^{(2\pi\epsilon_0\epsilon_r l/\omega_0)}-1)$$

The concept described herein represents protection/insulation against line-bound and radiation-bound perturbations from the outside, as well as inside the conductive cage structure 120, for frequencies which are greater than the cutoff frequency $\omega_o$. A lower value of the reactance $X_c$ ensures an uninterrupted skin of the conductive cage structure 120.

In other words, a sensor (for example the MEMS sensor module 110) or any other type of electronic device may have some connections to the surroundings/outside world. As shown in FIG. 3, these connections may for example comprise RF (radiofrequency) transmission lines 132 and lines for general input/output (I/O) signals (for example the connecting lines $130_1$, $130_2$). These I/O connecting lines may, for example, represent an energy supply or provide analog or digital signals.

Optionally, the conductive cage structure 120 may be connected to a ground potential 150. In this way, charges may be transported away from the conductive cage structure 120, so that no or only little charging of the electrically conductive cage structure 120 occurs.

Optionally, the MEMS sensor module 100 may be connected via a connection 152 to the conductive cage structure 120 potential-free, to a reference potential or to a ground potential. The MEMS sensor module 110 may therefore have the same reference potential as the conductive cage structure 120. FIG. 3 represents both a connecting line 154 to a reference potential or a ground potential, and the ground potential 150. For effective suppression of stray radiofrequency signals, either the connecting line 154 or the ground potential 150 alone may already be sufficient.

FIG. 3 shows an extensive use of a Faraday cage. This may be achieved by the combined effect of the conductive cage structure 120 with capacitive elements $140_1$, $140_2$, $140_3$ and a transmission line 132. The intention is to protect the MEMS sensor module 110 (ASIC or another type of component) from radiofrequency interference (for example stray electromagnetic radiation with a stray wavelength $\lambda o$) which may enter the cage from outside world (the surroundings), or alternatively to suppress stray electromagnetic radiation of the MEMS sensor module 110 in order to avoid signal transmission or radiation from inside the cage outward. The concept therefore functions in both directions.

Figure 4:
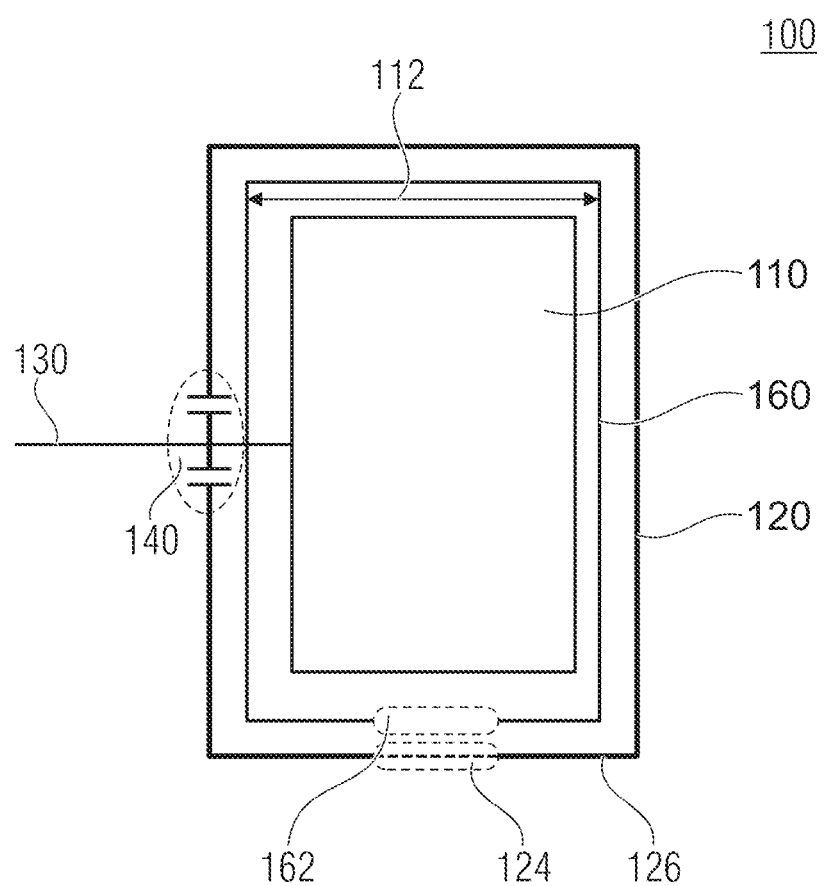
FIG. 4 shows a schematic representation of a device having a MEMS sensor module, which comprises a housing with an access opening, according to one exemplary embodiment.

FIG. 4 shows a schematic representation of a device 100 which comprises a MEMS sensor module 110, a conductive cage structure 120 enclosing the MEMS sensor module 110 and a connecting line 130, which is fed through the conductive cage structure 120 by means of a capacitive element 140.

The MEMS sensor module 110 may comprise a housing 160 with an access opening 162 to an internal volume of the MEMS sensor module 110. The conductive cage structure 120 may comprise a conductive mesh structure 124 at least next to the access opening 162 of the MEMS sensor module 110. Optionally, the conductive mesh structure may fully enclose the MEMS sensor module 110. The fact that the conductive mesh structure 124 may be arranged directly next to the access opening 162 of the MEMS sensor module 110 makes it possible, for example, that properties of the environment can be recorded or detected rapidly and simply by the MEMS sensor module 110. To this end, the conductive mesh structure may for example be fluidically transparent so that properties of the surroundings in the form of gas (for example air) may enter the internal volume of the MEMS sensor module 110. Exchange with the surroundings is therefore achieved by the conductive mesh structure 124.

According to one exemplary embodiment, the MEMS sensor module 110 comprises a housing 160 with an access opening 162 to an internal volume of the MEMS sensor module 110, and the conductive cage structure 120 may comprise a continuous metal layer at least in regions. The effect achievable in this way is that no or scarcely any stray electromagnetic radiation with a stray wavelength $\lambda_o$ can penetrate into an internal volume of the conductive cage structure 120 and therefore as far as the MEMS sensor module 110. Both the continuous metal layer 126 and the conductive mesh structure 124 of the conductive cage structure 120 can efficiently shield stray electromagnetic radiation.

According to one exemplary embodiment, the continuous metal layer may comprise a conductive mesh structure 124 or an opening next to the access opening 162 of the MEMS sensor module 110. The conductive cage structure 120 may therefore, for example, have regions which comprise a continuous metal layer 126 and regions which comprise the conductive mesh structure or an opening. In this case, at least one region with the conductive mesh structure or the opening may be arranged next to the access opening 162 of the MEMS sensor module 110. As already described, the conductive mesh structure 124 or an opening next to the access opening 162 of the MEMS sensor module 110 may allow access of the MEMS sensor module 110 to the surroundings with at the same time shielding of stray electromagnetic radiation with a stray wavelength $\lambda_o$.

According to one exemplary embodiment, the continuous metal layer 126 may fully enclose the MEMS sensor module 110 except for the conductive mesh structure 124 or the opening. This makes it possible for the MEMS sensor module 110 to be shielded from stray electromagnetic radiation on all sides.

According to one exemplary embodiment, the conductive mesh structure 124 may be configured to be fluidically transparent and have a lattice spacing g which is at most $\frac{1}{100}$, $\frac{1}{200}$, $\frac{1}{500}$, $\frac{1}{800}$ or $\frac{1}{1000}$ of the stray wavelength $\lambda_o$ of the stray radiation to be suppressed and at most $\frac{1}{10}$ of the shortest edge length K 112 of the housing 160 of the MEMS sensor module 110 ($g \leq \frac{1}{100}\lambda_o$, $g \leq \frac{1}{10}K$). The openings of the mesh structure are thus selected in such a way that effective shielding of stray radiofrequency radiation by the MEMS sensor module 110 can be achieved. Optionally, the lattice spacing g may also be at most ½, ⅓, ¼, ⅕ or ⅛ of the shortest edge length K 112.

According to one exemplary embodiment, the shortest edge length K may also define the shortest edge length K of the conductive cage structure 120. In this way, the conductive cage structure comprises, for example, at least to 10 openings on the shortest edge if the lattice spacing g is at most 1/10 of the shortest edge length K.

Optionally, instead of the conductive mesh structure 124, the conductive cage structure 120 may comprise the opening. According to one exemplary embodiment, the opening may be configured to be fluidically transparent and have a diameter which is at most 1/100, 1/200, 1/500, 1/800 or 1/1000 of the stray wavelength $\lambda_o$ of the stray radiation to be suppressed. In this way, instead of the conductive mesh structure 124, the conductive cage structure 120 may for example also comprise a single opening which is dimensioned to be so small that, although exchange with the surroundings is possible (fluidically transparent), no or scarcely any stray electromagnetic radiation of the wavelength $\lambda_o$ can penetrate to the MEMS sensor module 100 through the conductive cage structure 120.

The opening may have features and functionalities as described in FIG. 1.

FIG. 5a and FIG. 5b respectively show a device 100 which comprises a MEMS sensor module 110 with an enclosing housing 160. The MEMS sensor module may furthermore comprise a conductive cage structure 120, which encloses the MEMS sensor module 110, and seven connecting lines 130₁ to 130₇, each having a capacitive element 140₁ to 140₇ by means of which the respective connecting line can be fed through the conductive cage structure 120 in order to be connected to the MEMS sensor module 110.

The difference between FIG. 5a and FIG. 5b resides in the conductive cage structure 120.

Thus, the conductive cage structure 120 of FIG. 5a may for example comprise a continuous metal layer at least in regions, and in other regions may for example comprise a conductive mesh structure or an opening. The continuous metal layer may, for example, fully enclose the MEMS sensor module 110 except for the regions with the conductive mesh structure or the opening.

In FIG. 5b, on the other hand, the entire conductive cage structure 120 comprises a conductive mesh structure, which for example fully encloses MEMS sensor module 110. In other words, for example, the conductive cage structure 120 may be a fine-meshed metal grid which may also be used as a particle filter. The MEMS sensor module 100 is therefore, for example, protected by the conductive cage structure 120 not only from stray electromagnetic radiation but also from particles. Undesired particles may damage the MEMS sensor module 110 or impair its detection, which may be avoided by the conductive cage structure 120.

The connecting lines 130₁ to 130₇ of FIG. 5a and FIG. 5b may for example be VDD (supply voltage), SCL (serial clock), SDA (serial data), ADR (address select), OUT− (negative output), OUT+ (dd) and/or VSS (ground) lines.

The MEMS sensor module 110 may be a silicon microphone module.

Per connecting line 130₁ to 130₇, for example, only one capacitive element 140₁ to 140₇ is required. The capacitive elements 140₁ to 140₇ may take values for a capacitance in the range of from one femtofarad (1 fF) to one millifarad (1 mF), from one picofarad (1 pF) to one microfarad (1 μF) or from one picofarad (1 pF) to one nanofarad (1 nF), for example 100 pF.

FIG. 5a and FIG. 5b show a comprehensive application of electromagnetic (EM) radiofrequency interference (RFI) protection for microphone modules based on the concept described herein (see inter alia FIG. 1, FIG. 2a, 2b, FIG. 3 and FIG. 4).

Figure 6:
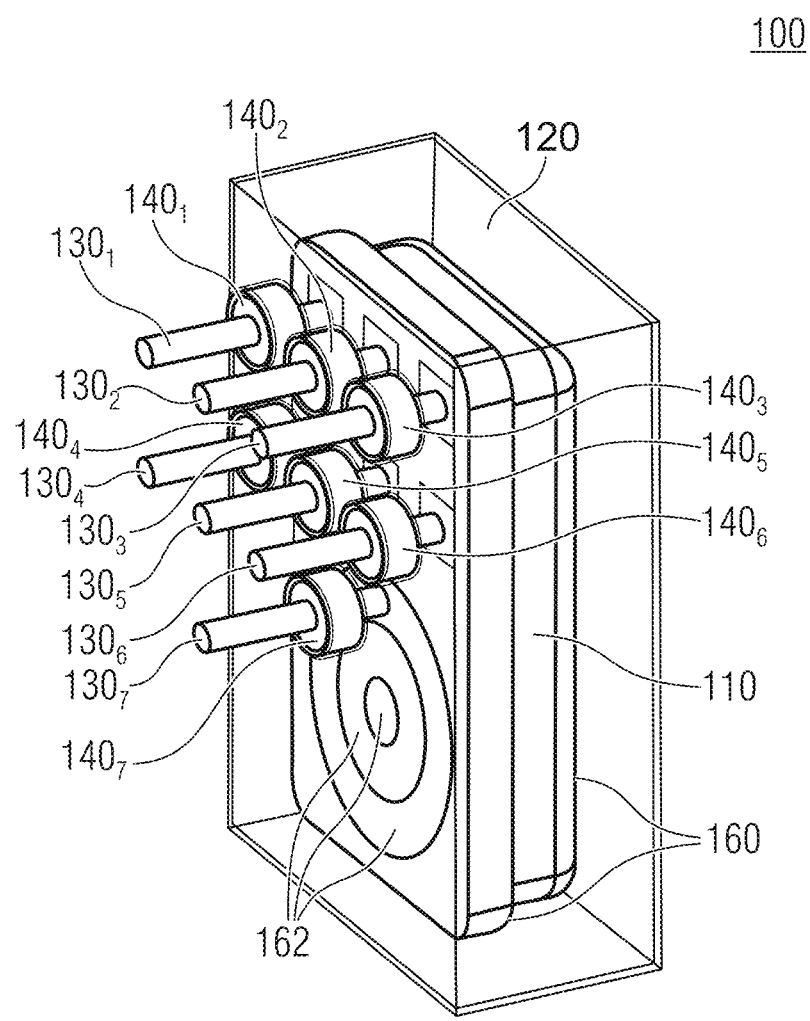
FIG. 6 shows a schematic representation of a device represented three-dimensionally according to one exemplary embodiment.

FIG. 5a and FIG. 5b may for example represent an equivalent electrical circuit diagram for the device represented in FIG. 6. Therefore, FIG. 6 may have the same features, properties and functions as the device 100 of FIG. 5a and FIG. 5b.

The conductive cage structure 120 is in FIG. 5b according to this exemplary embodiment a fine-meshed grid structure which fully encloses the MEMS sensor module 110.

The housing 160 comprises an access opening 162 to an internal volume of the MEMS sensor module 110. Through this access opening 162, the MEMS sensor module 110 can detect properties of the surroundings.

The MEMS sensor module 110 is, for example, positioned and held in the conductive cage structure 120 by means of the connecting lines 130₁ to 130₇. The connecting lines 130₁ to 130₇ may, for example, be contact pins.

By the connecting lines 130₁ to 130₇, a distance between the MEMS sensor module 110 and the conductive cage structure 120 may be adjusted. In this way, for example, the MEMS sensor module 110 is a distance all around from the conductive cage structure 120. For example, intermediate space 122 resulting from this ensures thermal insulation. In other words, the conductive cage structure 120 is, for example, arranged thermally insulated from the MEMS sensor module 110. The distance may in this case be a few μm. In the intermediate space, resulting from the distance, between the MEMS sensor module 110 and the conductive cage structure 120, a thermally insulating medium, for example air, may be arranged at least in regions. In this way, it is possible to prevent stray thermal radiation from influencing the detection by the MEMS sensor module 110.

The device 100 of FIG. 6 may fulfill several functions:
1. Diversion and conduction of RF (radiofrequency) currents, caused by an RF line and radiation, to/onto the outer side of the conductive cage structure 120.
2. Shielding of any RFI transmission (conducted or radiated) into the microphone module (MEMS sensor module 110).
3. Surface heating due to RFI occurs only on the outer skin (outer surfaces (of the conductive cage structure 120 (surfaces facing away from MEMS sensor module 110). Scarcely any or no noise generated by RFI-coupled thermoacoustics therefore occurs inside the microphone module (MEMS sensor module 110).
4. The fine-meshed grid (conductive cage structure 120) may additionally act as a particle barrier/filter.

The device 100 may be mounted in an extremely RFI-severe environment without degrading the performance of the sensor module or microphone module (MEMS sensor module 110) with the protective casing (conductive cage structure 120).

FIG. 7a, FIG. 7b, FIG. 7c, FIG. 7d and FIG. 7e show schematic representations of details of a conductive mesh structure 124 which the conductive cage structure 120 of the device 100 may comprise.

Figure 7A:
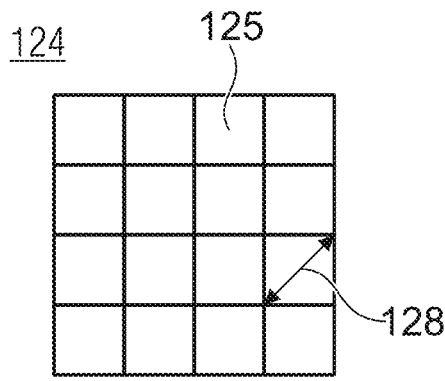
FIG. 7a shows a schematic representation of a square conductive mesh structure which the conductive cage structure according to one exemplary embodiment may comprise.

FIG. 7a shows for example a conductive mesh structure 124 with square meshes 125. The lattice spacing g 128 of the square meshes 125 may be defined as the diagonal of the square meshes 125.

Figure 7B:
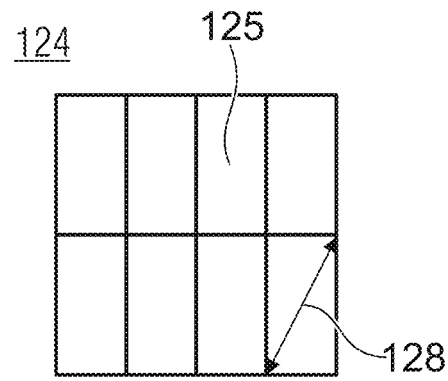
FIG. 7b shows a schematic representation of a rectangular conductive mesh structure which a conductive cage structure according to one exemplary embodiment may comprise.

FIG. 7b shows a conductive mesh structure 124 with rectangular meshes 125. The lattice spacing g 128 of the rectangular meshes 125 may be defined as the diagonal.

Figure 7C:
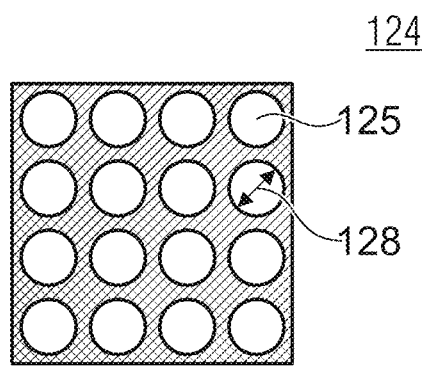
FIG. 7c shows a schematic representation of a circular mesh structure which a conductive cage structure according to one exemplary embodiment may comprise.

FIG. 7c shows a conductive mesh structure 124 with circular meshes 125. The lattice spacing g 128 of the circular meshes 125 may be defined as the diagonal of the circular meshes 125.

Figure 7D:
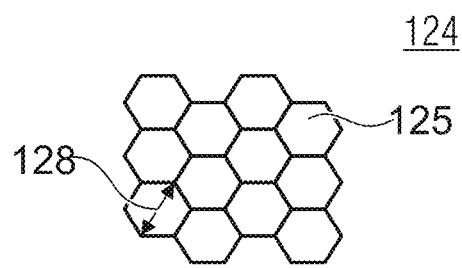
FIG. 7d shows a schematic representation of a hexagonal mesh structure which the conductive cage structure according to one exemplary embodiment may comprise.

FIG. 7d shows a conductive mesh structure 124 with hexagonal meshes 125. The lattice spacing g 128 of the hexagonal meshes 125 may be defined as the internal dimension of the hexagonal meshes 125.

Figure 7E:
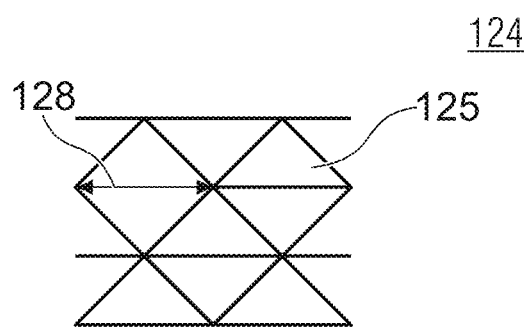
FIG. 7e shows a schematic representation of a triangular mesh structure which the conductive cage structure according to one exemplary embodiment may comprise.

FIG. 7e shows a conductive mesh structure 124 with triangular meshes 125. The lattice spacing g 128 may, for the triangular meshes 125, be defined as the longest edge of the triangular meshes 125.

The shapes represented in FIGS. 7a to 7e of the meshes 125 of the conductive mesh structure 124 are to be regarded here as exemplary and not exhaustive. It should be mentioned that, for example, combinations of the mesh shapes referred to in FIGS. 7a-7e may also be produced, so that for example irregular grids may be produced.

FIGS. 8a, 8b, 8c and 8d show various possible shapes of a housing and/or of a conductive cage structure 160/120 of the MEMS sensor module 110. In this case, it should be noted that the shortest edge length $K_{112}$ may be determined identically both for the housing of the MEMS sensor module and for the conductive cage structure. According to one exemplary embodiment, the conductive cage structure may be the housing of the MEMS sensor module.

Figure 8A:
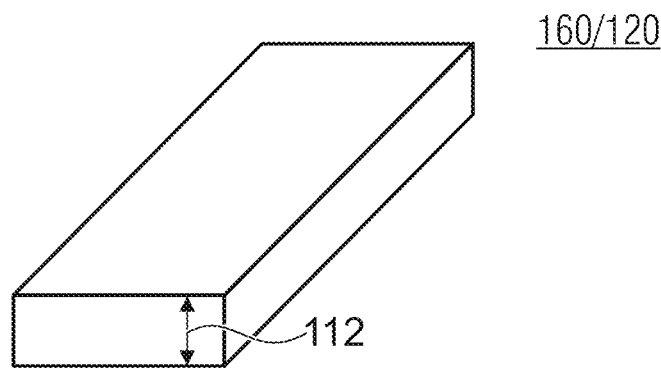
FIG. 8a shows a schematic representation of a conductive cage structure or of a housing, which has the shape of a cuboid, according to one exemplary embodiment.

For example, FIG. 8a shows the housing/cage structure 160/120 in the form of a cuboid. The shortest edge length K 112 of the housing/cage structure 160/120 may therefore be defined, for example, as the height.

Figure 8B:
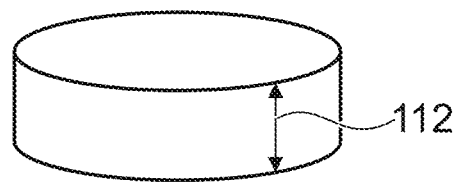
FIG. 8b shows a schematic representation of a conductive cage structure or of a housing, which has the shape of a laterally extended cylinder, according to one exemplary embodiment.

FIG. 8b shows the housing/cage structure 160/120 in the form of a wide cylinder. In this case, the shortest edge length K 112 of the housing/cage structure 160/120 may be defined, for example, as the height.

Figure 8C:
FIG. 8c shows a schematic representation of a conductive cage structure or of a housing, which has the shape of a longitudinally extended cylinder, according to one exemplary embodiment.

FIG. 8c shows the housing/cage structure 160/120 in the form of a longitudinally extended cylinder. The shortest edge length K 112 may therefore be defined as the diameter of the cylinder.

Figure 8D:
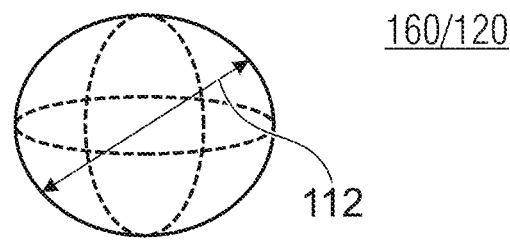
FIG. 8d shows a schematic representation of a conductive cage structure or of a housing, which has the shape of a sphere, according to one exemplary embodiment.

FIG. 8d shows the housing/cage structure 160/120 in the form of a sphere. The shortest edge length K 112 may therefore be defined as the diameter of the sphere.

The various shapes of the housing/cage structure 160/120 for the device 100, which are represented in FIGS. 8a, 8b, 8c and 8d, are in this case to be regarded as exemplary and not as exhaustive.

Figure 9:
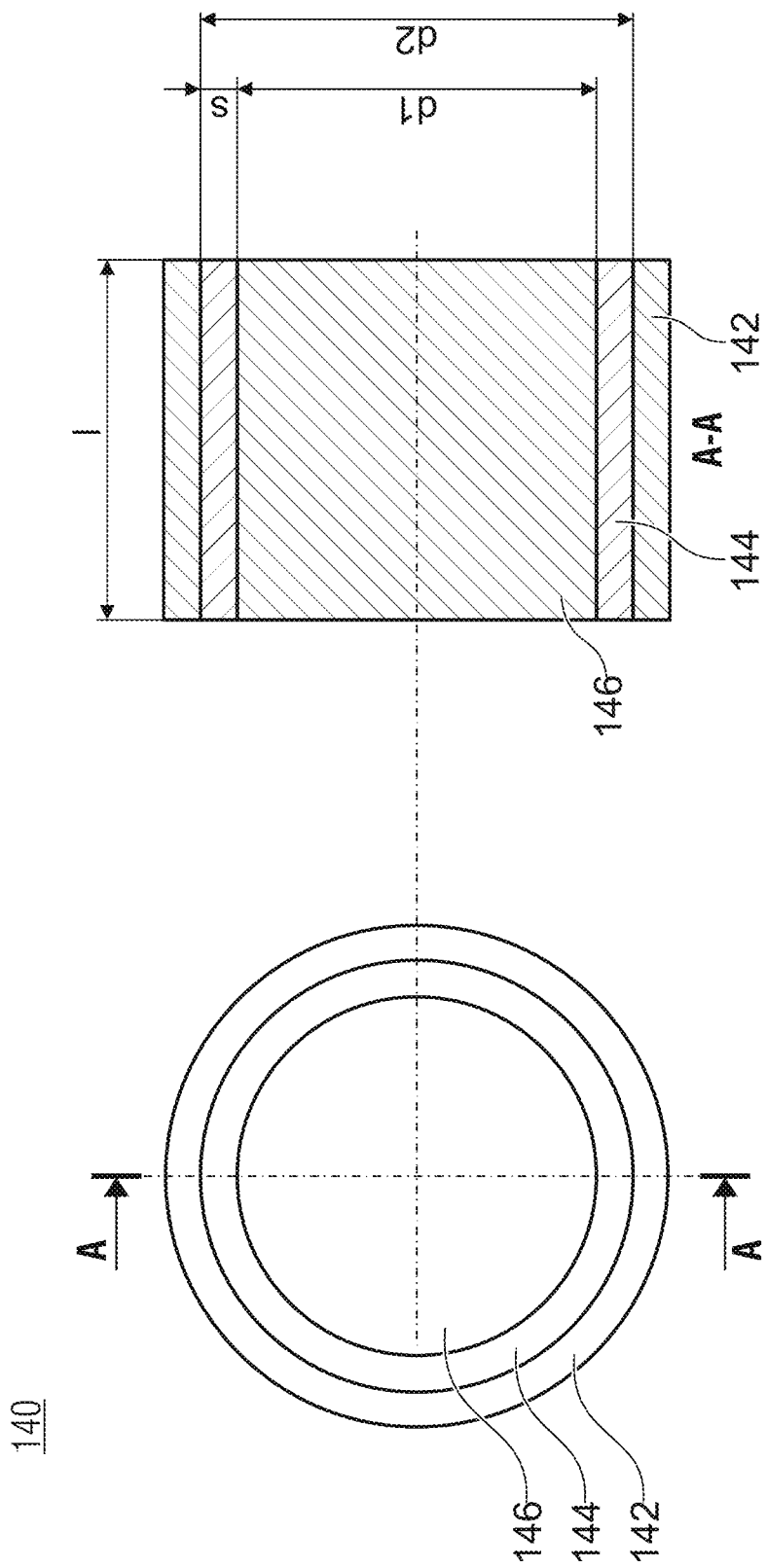
FIG. 9 shows a schematic representation of a capacitive element according to one exemplary embodiment.

FIG. 9 shows a schematic representation of a capacitive element 140, such as may be used for the device 100. The capacitive elements of FIG. 1, FIG. 2a, FIG. 2b, FIG. 3, FIG. 4, FIG. 5a, FIG. 5b and FIG. 6 may be produced as coaxial feed-through capacitors, as represented in FIG. 9. The capacitive element 140 may be a coaxial feed-through capacitor 140, which comprises an outer conductor 142, a dielectric layer 144 and an inner conductor 146.

The capacitance of the coaxial feed-through capacitor 140 may, with the assumption that $X_c=1$ at a frequency $\omega_o$, be calculated as follows:

$$C = \frac{2\pi\epsilon_0\epsilon_r l}{\ln\frac{d_2}{d_1}} = \frac{2\pi\epsilon_0\epsilon_r l}{\ln\frac{d_1+2s}{d_1}} = \frac{2\pi\epsilon_0\epsilon_r l}{\ln\frac{d_2}{d_2-2s}} = \frac{1}{\omega_o}$$

By solving this formula, which is based on the assumption that the reactance $X_c=1$ at a frequency $\omega_o$, the required thickness of the dielectric layer 144 may be calculated as follows:

$$s = \tfrac{1}{2}d_1(e^{(2\pi\epsilon_0\epsilon_r l\omega_0)}-1)$$

FIGS. 10a, 10b and 10c show various cross sections of the device 100. According to one exemplary embodiment, shown in FIGS. 10a, 10b and 10c, the conductive cage structure may be implemented as a part of the housing for the MEMS sensor module.

The conductive cage structure may comprise a first conductive surface 121a, which represents an internal ground plane of the MEMS sensor module, and a second conductive surface 121b. The two surfaces (the first conductive surface 121a and the second conductive surface 121b) may, for example, delimit the MEMS sensor module on opposite sides. For example, components of the MEMS sensor module may lie between the first conductive surface 121a and the second conductive surface 121b. The first conductive surface 121a may, for example, be connected to the second conductive surface 121b by means of vias 129 arranged at the edge regions. A spacing of the vias 129 may correspond to the lattice spacing g. The conductive cage structure may therefore, for example, be implemented directly on the MEMS sensor module and constitute the housing of the MEMS sensor module.

According to one exemplary embodiment, a first group of the vias 129a may be arranged at edge regions of the MEMS sensor module and a second group of the vias 129b may be arranged around an access opening 162 of the MEMS sensor module. According to FIGS. 10a, 10b and 10c, the access opening 162 may constitute the sound port of a silicon microphone, if the MEMS sensor module for example constitutes a MEMS sound transducer module. The first conductive surface, the second conductive surface and the vias 129a, 129b together constitute for example the conductive cage structure, which may act as a Faraday cage. The conductive cage structure 120 may, for example, be connected to the sound port 162 in the housing plane or by fastening a conductive mesh structure 124 on the structure onto which the housing can be placed.

Six connecting lines may be formed by integrated capacitive elements 140 and terminals which penetrate through the internal ground plane (the internal ground plane is for example a part of the conductive cage structure, see the first conductive surface 121a).

According to a first aspect, the device 100 comprises a MEMS sensor module 110; a conductive cage structure 120, the conductive cage structure 120 enclosing the MEMS sensor module 110 in order to suppress penetration of stray electromagnetic radiation with a stray wavelength $\lambda_o$ into the conductive cage structure 120, and the conductive cage structure 120 being arranged thermally insulated from the MEMS sensor module 110; and at least one connecting line 130, $130_1$-$130_7$, the at least one connecting line 130, $130_1$-$130_7$ being connected to the MEMS sensor module 110 and fed through the conductive cage structure 120 by means of a capacitive element 140, $140_1$-$140_7$.

According to another aspect, the MEMS sensor module 110 comprises a housing 160 with an access opening 162 to an internal volume of the MEMS sensor module 110, and the conductive cage structure 120 comprises a conductive mesh structure 124 at least next to the access opening 162 of the MEMS sensor module 110.

According to another aspect, the conductive mesh structure 124 fully encloses the MEMS sensor module 110.

According to another aspect, the MEMS sensor module 110 comprises a housing 160 with an access opening 162 to an internal volume of the MEMS sensor module 110, and the conductive cage structure 120 comprises a continuous metal layer at least in regions.

According to another aspect, the continuous metal layer comprises a conductive mesh structure 124 or an opening next to the access opening 162 of the MEMS sensor module 110.

According to another aspect, the continuous metal layer fully encloses the MEMS sensor module 110 except for the conductive mesh structure 124 or the opening.

According to another aspect, the conductive mesh structure 124 is fluidically transparent and has a lattice spacing g 128 which is at most $1/100$ of the stray wavelength $\lambda_o$ of the stray radiation to be suppressed and at most $1/10$ of the shortest edge length K 112 of the housing 160 of the MEMS sensor module 110 (g≤$1/100\lambda_o$, g≤$1/10$K).

According to another aspect, the lattice spacing g 128 is at most $1/200$, $1/500$, $1/800$ or $1/1000$ of the stray wavelength $\lambda_o$ of the stray radiation to be suppressed.

According to another aspect, the opening is fluidically transparent and has a diameter which is at most $1/100$ of the stray wavelength $\lambda_o$ of the stray radiation to be suppressed.

According to another aspect, the conductive cage structure 120 is at a distance from the MEMS sensor module 110, and a thermally insulating medium is arranged at least in regions in an intermediate space 122 between the conductive cage structure 120 and the MEMS sensor module 110.

According to another aspect, the capacitive element 140, $140_1$-$140_7$ has at least a capacitance of $$C \geq \frac{1}{\omega_0 \cdot X_C} = \frac{1}{\omega_0},$$

the reactance being $X_c \leq 1$ and $\omega_o$ being the angular frequency of the stray electromagnetic radiation.

According to another aspect, the capacitive element 140, $140_1$-$140_7$ is a coaxial feed-through capacitor 140, $140_1$-$140_7$.

According to another aspect, the conductive cage structure 120 is configured as a mechanical particle protection.

According to another aspect, the conductive cage structure 120 is implemented as a part of the housing 160 for the MEMS sensor module 110.

According to another aspect, the conductive cage structure 120 comprises a first conductive surface 121a, which constitutes an internal ground plane of the MEMS sensor module 110, and a second conductive surface 121b, with components of the MEMS sensor module 110 lying between the first conductive surface 121a and the second conductive surface 121b; and the first conductive surface 121a is connected to the second conductive surface 121b by means of vias 129a arranged at the edge regions and a spacing of the vias 129a, 129b corresponds to a lattice spacing g 128.

According to another aspect, a first group of the vias 129a are arranged at edge regions of the MEMS sensor module 110 and a second group of the vias 129b are arranged around an access opening 162 of the MEMS sensor module 110.

According to another aspect, the device 100 comprises at least one impedance-matched connecting line 132 in the form of a coaxial cable, with which RF signals are transmitted to the MEMS sensor module 110.

According to another aspect, the MEMS sensor module 110 is connected via a connection to the conductive cage structure 120 potential-free, to a reference potential or to a ground potential.

According to another aspect, the conductive cage structure 120 is configured in order to conduct acoustic sound waves with low attenuation through the conductive cage structure 120.

According to another aspect, the capacitive element 140, $140_1$-$140_7$ is configured in order to dissipate stray radiofrequency signals from the at least one connecting line 130, $130_1$-$130_7$ onto surfaces of the conductive cage structure 120 which face away from the MEMS sensor module 110.

According to another aspect, the MEMS sensor module 110 is a MEMS sound transducer module, a MEMS gas sensor module or a MEMS pressure sensor module.

According to another aspect, the conductive cage structure 120 is connected to a reference potential or a ground potential.

Although many aspects have been described in connection with a device, it is to be understood that these aspects also represent a description of the corresponding method, so that a block or component of a device is also to be understood as a corresponding method step or as a feature of a method step. In a similar way to this, aspects which have been described in connection with or as a method step also represent a description of a corresponding block or detail or feature of a corresponding device. Some or all of the method steps may be carried out by a hardware apparatus (or by using a hardware apparatus), for example a microprocessor, a programmable computer or an electronic circuit. In some exemplary embodiments, some or several of the most important method steps may be carried out by such an apparatus.

Depending on particular implementation requirements, exemplary embodiments may be implemented in hardware or in software. The implementation may be carried out by using a digital storage medium, for example a floppy disk, a DVD, a Blu-ray disc, a CD, a ROM, a PROM, an EPROM, an EEPROM or a FLASH memory, a hard disk or another magnetic or optical memory on which electronically readable control signals are stored, which may interact or do interact with a programmable computer system in such a way that the respective method is carried out. The digital storage medium may therefore be computer-readable.

Many exemplary embodiments thus comprise a data carrier which comprises electronically readable control signals that are capable of interacting with a programmable computer system in such a way that one of the methods described herein is carried out.

In general, exemplary embodiments may be implemented as a computer program product having a program code, the program code is effective for carrying out one of the methods when the computer program product is run on a computer.

The program code may, for example, also be stored on a machine-readable carrier.

Other exemplary embodiments comprise the computer program for carrying out one of the methods described herein, wherein the computer program is stored on a machine-readable carrier.

In other words, one exemplary embodiment of the method is therefore a computer program which comprises a program code for carrying out one of the methods described herein when the computer program is run on a computer.

A further exemplary embodiment of the method is therefore a data carrier (or a digital storage medium or a computer-readable medium) on which the computer program for carrying out one of the methods described herein is recorded. The data carrier, the digital storage medium or the computer-readable medium are typically physical and/or nonperishable or non-temporary.

A further exemplary embodiment of the method is therefore a datastream or a sequence of signals, which represents or represent the computer program for carrying out one of the methods described herein. The datastream or the sequence of signals may, for example, be configured so as to be transferred via a data communication link, for example via the Internet.

A further exemplary embodiment comprises a processing device, for example a computer or a programmable logic component, which is configured or adapted so as to carry out one of the methods described herein.

A further exemplary embodiment comprises a computer on which the computer program for carrying out one of the methods described herein is installed.

A further exemplary embodiment comprises a device or a system which is configured in order to transmit a computer program for carrying out at least one of the methods described herein to a receiver. The transmission may, for example, be carried out electronically or optically. The receiver may for example be a computer, a mobile device, a storage device or a similar device. The device or the system may, for example, comprise a file server for transmitting the computer program to the receiver.

In many exemplary embodiments, a programmable logic component (for example a field-programmable gate array, a FPGA) may be used in order to carry out many or all functionalities of the methods described herein. In many exemplary embodiments, a field-programmable gate array may interact with a microprocessor in order to carry out one of the methods described herein. In general, in some exemplary embodiments the methods are carried out on the part of any desired hardware device. This may be universally usable hardware such as a computer processor (CPU) or specific hardware for the method, for example an ASIC.

The devices described herein may, for example, be implemented by using a hardware apparatus, or by using a computer, or by using a combination of a hardware apparatus and a computer.

The devices described herein, or any components of the devices described herein, may at least partially be implemented in hardware and/or in software (computer program).

The methods described herein may, for example, be implemented by using a hardware apparatus, or by using a computer, or by using a combination of a hardware apparatus and a computer.

The methods described herein, or any components of the methods described herein, may be carried out at least partially by hardware and/or by software.

Although some aspects of the present disclosure have been described as features in connection with a device, it is clear that such a description may likewise be regarded as a description of corresponding method features. Although some aspects have been described as features in connection with a method, it is clear that such a description may also be regarded as a description of corresponding features of a device, or of the functionality of a device.

In the detailed description above, various features have sometimes been grouped together in examples in order to rationalize the disclosure. This type of disclosure should not be interpreted as meaning that the claimed examples comprise more features than are explicitly specified in each claim. Rather, as the appended claims reflect, the subject-matter may reside in fewer than all the features of an individual disclosed example. Consequently, the appended claims are hereby included in the detailed description, and each claim may stand as an individual separate example. Although each claim may stand as an individual separate example, it should be noted that, although dependent claims in the claims refer back to a specific combination with one or more other claims, other examples may also comprise a combination of dependent claims with the subject-matter of any other dependent claim or a combination of any feature with other dependent or independent claims. Such combinations are to be included unless it is mentioned that a specific combination is not intended. It is furthermore intended that a combination of features of one claim with any other independent claim is also included, even if this claim is not directly dependent on the independent claim.

Although specific exemplary embodiments have been presented and described herein, it will be clear to the person skilled in the art that many alternative and/or equivalent implementations may be substituted for the exemplary embodiments specifically shown and presented there, without departing from the subject-matter of the present application. This application text is intended to cover all adaptations and variations of the specific exemplary embodiments described and discussed herein. The present application subject-matter is therefore limited only by the wording of the claims and the equivalent embodiments thereof.

What is claimed is:

1. A device, comprising:
   a Micro-ElectroMechanical System (MEMS) sensor module;
   a conductive cage structure, the conductive cage structure enclosing the MEMS sensor module in order to suppress penetration of stray electromagnetic radiation with a stray wavelength $\lambda_o$ into the conductive cage structure, and the conductive cage structure being arranged thermally insulated from the MEMS sensor module; and
   at least one connecting line, the at least one connecting line being connected to the MEMS sensor module and fed through the conductive cage structure by a capacitive element.

2. The device as claimed in claim 1, wherein the MEMS sensor module comprises a housing with an access opening to an internal volume of the MEMS sensor module, and wherein the conductive cage structure comprises a conductive mesh structure at least next to the access opening of the MEMS sensor module.

3. The device as claimed in claim 2, wherein the conductive mesh structure fully encloses the MEMS sensor module.

4. The device as claimed in claim 2, wherein the conductive mesh structure is fluidically transparent and has a lattice spacing g which is at most 1/100 of the stray wavelength $\lambda_o$ of the stray radiation to be suppressed and at most 1/10 of the shortest edge length K of a housing of the MEMS sensor module.

5. The device as claimed in claim 4, wherein the lattice spacing g is at most 1/200, 1/500, 1/800 or 1/1000 of the stray wavelength $\lambda_o$ of the stray radiation to be suppressed.

6. The device as claimed in claim 1, wherein the MEMS sensor module comprises a housing with an access opening to an internal volume of the MEMS sensor module, and wherein the conductive cage structure comprises a continuous metal layer at least in regions.

7. The device as claimed in claim 6, wherein the continuous metal layer comprises a conductive mesh structure or an opening next to the access opening of the MEMS sensor module.

8. The device as claimed in claim 7, wherein the opening is fluidically transparent and has a diameter which is at most $\frac{1}{100}$ of the stray wavelength $\lambda_o$ of the stray radiation to be suppressed.

9. The device as claimed in claim 7, wherein the continuous metal layer fully encloses the MEMS sensor module except for a conductive mesh structure or the opening.

10. The device as claimed in claim 1, wherein the conductive cage structure is at a distance from the MEMS sensor module, and a thermally insulating medium is arranged at least in regions in an intermediate space between the conductive cage structure and the MEMS sensor module.

11. The device as claimed in claim 1, wherein the capacitive element has at least a capacitance of $$C \geq \frac{1}{\omega_0 \cdot X_C} = \frac{1}{\omega_0},$$

a reactance being $X_c \leq 1$ and $\omega_o$ being an angular frequency of the stray electromagnetic radiation.

12. The device as claimed in claim 1, wherein the capacitive element is a coaxial feed-through capacitor.

13. The device as claimed in claim 1, wherein the conductive cage structure is configured as a mechanical particle protection.

14. The device as claimed in claim 1, wherein the conductive cage structure is implemented as a part of a housing for the MEMS sensor module.

15. The device as claimed in claim 1, wherein the conductive cage structure comprises a first conductive surface, which constitutes an internal ground plane of the MEMS sensor module, and a second conductive surface;

wherein components of the MEMS sensor module lie between the first conductive surface and the second conductive surface; and the first conductive surface is connected to the second conductive surface by vias arranged at edge regions, and a spacing of the vias corresponds to a lattice spacing.

16. The device as claimed in claim 15, wherein a first group of the vias are arranged at edge regions of the MEMS sensor module and a second group of the vias are arranged around an access opening of the MEMS sensor module.

17. The device as claimed in claim 1, wherein the device comprises at least one impedance-matched connecting line comprising a coaxial cable, with which RF signals are transmitted to the MEMS sensor module.

18. The device as claimed in claim 1, wherein the MEMS sensor module is connected via a connection to the conductive cage structure, potential-free, to a reference potential, or to a ground potential.

19. The device as claimed in claim 1, wherein the conductive cage structure is configured in order to conduct acoustic sound waves with low attenuation through the conductive cage structure.

20. The device as claimed in claim 1, wherein the capacitive element is configured in order to dissipate stray radiofrequency signals from the at least one connecting line onto surfaces of the conductive cage structure which face away from the MEMS sensor module.

21. The device as claimed in claim 1, wherein the MEMS sensor module is a MEMS sound transducer module, a MEMS gas sensor module or a MEMS pressure sensor module.

22. The device as claimed in claim 1, wherein the conductive cage structure is connected to a reference potential or a ground potential.

* * * * *